United States Patent
Goel et al.

(10) Patent No.: US 7,657,854 B2
(45) Date of Patent: Feb. 2, 2010

(54) METHOD AND SYSTEM FOR DESIGNING TEST CIRCUIT IN A SYSTEM ON CHIP

(75) Inventors: Himanshu Goel, Ghaziabad (IN); Amit Sharma, Agra (IN)

(73) Assignee: Freescale Semiconductor, Inc., Austin, TX (US)

( * ) Notice: Subject to any disclaimer, the term of this patent is extended or adjusted under 35 U.S.C. 154(b) by 205 days.

(21) Appl. No.: 11/866,965

(22) Filed: Oct. 3, 2007

(65) Prior Publication Data

US 2008/0127021 A1 May 29, 2008

(30) Foreign Application Priority Data

Nov. 24, 2006 (IN) .................. 2538/DEL/2006

(51) Int. Cl.
*G06F 17/50* (2006.01)
*G06F 9/45* (2006.01)

(52) U.S. Cl. ............... 716/5; 716/4; 716/7; 716/8; 716/9; 716/10; 714/726; 714/727; 714/728; 714/729

(58) Field of Classification Search ............ 716/4–5, 716/7–10; 714/726–729
See application file for complete search history.

(56) References Cited

U.S. PATENT DOCUMENTS

| | | | |
|---|---|---|---|
| 6,079,040 A * | 6/2000 | Hom et al. .................. 714/738 |
| 6,256,770 B1 * | 7/2001 | Pierce et al. .................. 716/18 |
| 6,314,539 B1 | 11/2001 | Jacobson et al. | |
| 6,711,708 B1 | 3/2004 | Shimomura | |
| 6,886,110 B2 | 4/2005 | O'Brien | |
| 6,988,230 B2 * | 1/2006 | Vermeulen et al. .......... 714/727 |
| 7,246,282 B2 | 7/2007 | Chau et al. | |
| 7,539,915 B1 * | 5/2009 | Solt ........................... 714/726 |
| 2004/0054950 A1 | 3/2004 | Larson et al. | |
| 2004/0268196 A1 | 12/2004 | Chau et al. | |
| 2006/0195739 A1 | 8/2006 | O'Brien | |

* cited by examiner

*Primary Examiner*—Thuan Do
*Assistant Examiner*—Nghia M Doan
(74) *Attorney, Agent, or Firm*—Charles Bergere

(57) ABSTRACT

A method and system for designing a test circuit in a System on Chip (SOC) includes identifying the test design constraints of the test circuit. The SOC is partitioned logically into a first set of logic blocks and a second set of logic blocks. A first set of scan chains is inserted in the first set of logic blocks, and a second set of scan chains is inserted in the second set of logic blocks, based on the test design constraints. Bypass circuits are inserted in the paths of the second set of scan chains, which are capable of bypassing at least one logic block of the second set of logic blocks during testing of the SOC.

9 Claims, 3 Drawing Sheets

METHOD AND SYSTEM FOR DESIGNING TEST CIRCUIT IN A SYSTEM ON CHIP

BACKGROUND OF THE INVENTION

The present invention relates generally to integrated circuits (ICs), and more specifically, to a method and system for designing a test circuit in a System on Chip (SOC).

An SOC usually includes several logic elements. These logic elements include the design logic specific to the basic features of the SOC and the design logic specific to certain applications of the SOC. Designers have observed that the application specific design logic has a significant gate count in the SOC. As the gate count in the SOC design increases considerably, it requires a lot of testing strategy, effort and time to verify the SOC against manufacturing defects. There has been a continuous effort to reduce cost involved in the testing process of the SOC.

There exist some standard testing techniques such as inserting multiple scan chains in the SOC design. In these techniques, a set of test patterns are applied through the multiple scan chains to test the SOC design for faults. In most of these techniques, multiple scan chains are inserted inside the SOC logic. A set of scan patterns is applied and the patterns are propagated through the SOC design, producing output scan data that is checked to ensure that the output response is same as that of expected response.

These existing techniques do not take into account the application-specific aspect of the logic blocks of the SOC. In a typical SOC, each logic block of the application-specific logic is not necessarily for the use of the target user. In these techniques, the length of the longest scan chain, and the number of scan chains used during the testing of the SOC, remains the same, even if testing of some of the application-specific logic blocks is not required.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

The detailed description, in connection with the appended drawings, is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for designing a test circuit in an SOC design is provided. The method includes identifying the test design constraints of the test circuit. The test design constraints include a number of scan chains and the average length of a scan chain. Further, the method includes logically partitioning the SOC design into a first set of logic blocks and a second set of logic blocks. The first set of logic blocks includes design logic that is specific to the basic features of the SOC design, and the second set of logic blocks includes the application-specific logic of the SOC design. The method also includes inserting a first set of scan chains in the first set of logic blocks and a second set of scan chains in the second set of logic blocks. Thereafter, a plurality of bypass circuits is inserted in the path of at least one scan chain of the second set of scan chains. Each of the bypass circuits is capable of bypassing at least one logic block of the second set of logic blocks during testing of the SOC design. If none of the second set of logic is bypassed, original scan distribution is achieved.

In another embodiment of the present invention, a system for designing a test circuit in an SOC design is provided. The system includes an SOC partitioning module and a circuit construction module. The SOC partitioning module logically partitions the SOC into a first set of logic blocks and a second set of logic blocks. The SOC partitioning module also partitions the second set of logic blocks into one or more sets of logic blocks. The circuit construction module is connected to the SOC partitioning module and inserts a first set of scan chains in the first set of logic blocks and a second set of scan chains in the second set of logic blocks. The circuit partitioning module also inserts a plurality of bypass circuits in the second set of logic blocks.

Embodiments of the present invention provide a method and system for designing a test circuit in an SOC design. The present invention can be used for designing a test circuit such that the scan chains are balanced and the length of the longest scan chain is optimized. The present invention reduces the testing cost of the SOC design having multiple application-specific design logic blocks. It also improves the manufacturing yield of the SOC chip design, since only application-specific logic blocks that are relevant for a target application are verified against the manufacturing faults.

Figure 1:
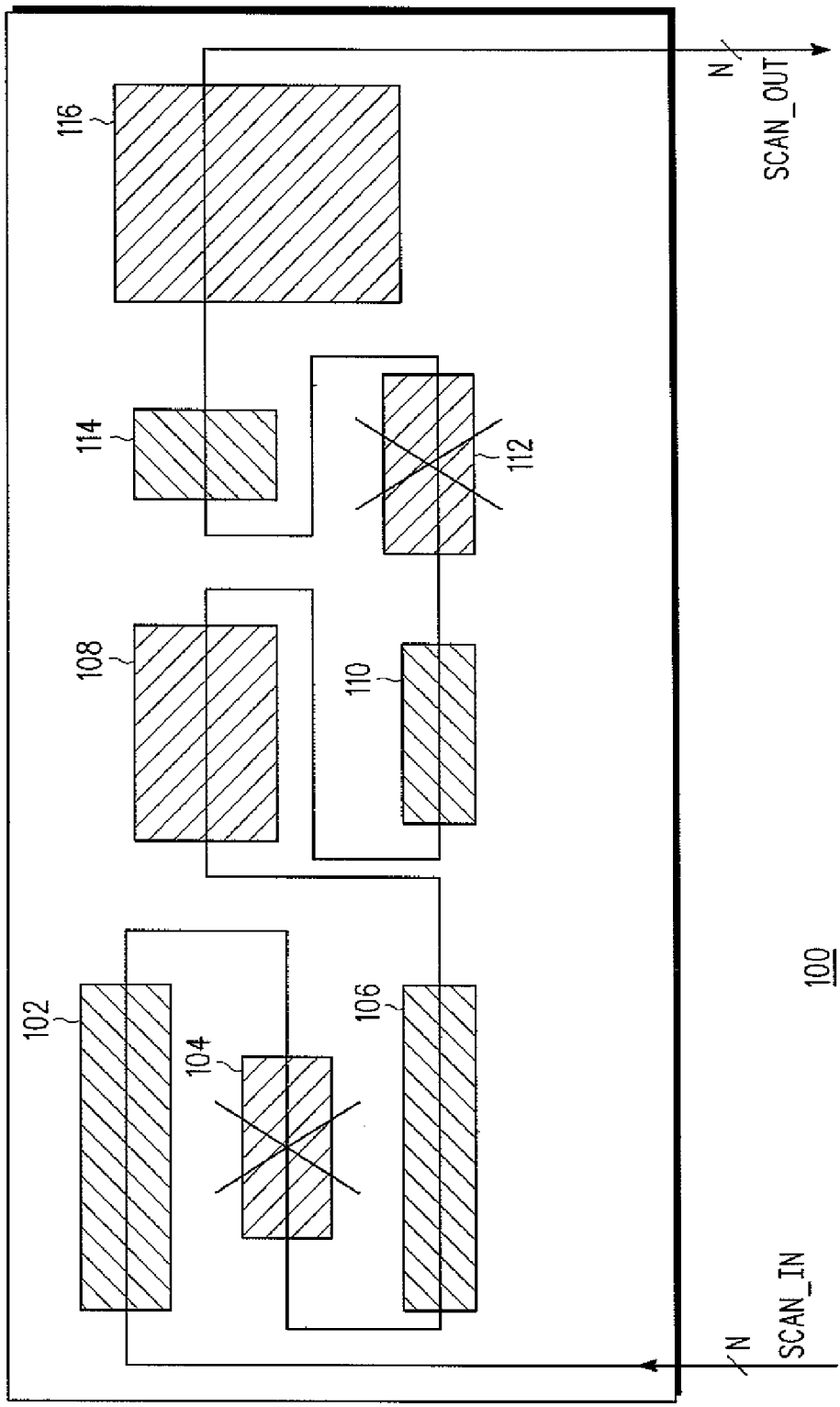
FIG. 1 is a schematic block diagram illustrating a conventional distribution of a set of scan chains in a System on Chip (SOC)

Referring now to FIG. 1, a schematic block diagram illustrating a conventional distribution of a set of scan chains in an SOC 100 is shown. The SOC 100 includes a first design logic block specific to the basic features (hereinafter referred to as 'BFL') 102, first application-specific logic (ASL) block 104, a second BFL block 106, a second ASL 108, a third BFL block 110, a third ASL 112, a fourth BFL block 114, and a fourth ASL 116. Examples of ASL blocks include Digital Signal Processors (DSP), microprocessors, microcontrollers, video controllers, cache controllers, Memory Management Units (MMUs), oscillators, Digital Phase-locked Loops (PLLs), Analog Interfaces such as Analog-to-Digital (ADC) converters, Digital-to-Analog (DACs) converters, interfaces related to industry standards such as Universal Serial Bus (USB), FireWire, Ethernet, universal synchronous asynchronous receiver-transmitters (USARTs), Serial Peripheral Interface (SPI), and the like. Examples of BFLs include basic blocks such as 'adders', 'subtractors', 'multipliers' and simple Arithmetic and Logical Units (ALUs), basic control units, simple memories, and the like. The conventional method of inserting a scan chain into the SOC design includes N (N≧1; N is an integer) parallel scan chains distributed serially among the logic blocks of the SOC 100. SCAN_IN represents a set of input signals applied through the N parallel scan chains in the SOC 100. Similarly, SCAN_OUT represents a set of output signals that exit the SOC 100 through the N parallel scan chains.

In a typical SOC design, the cost of a scan test can be determined as

Total scan test cost=$K$*number of scan patterns*number of scan chains*length of longest scan chain           (1)

Where K is a proportionality constant, and a scan pattern is a test vector used for testing the SOC. The number of scan patterns depends on the number of logic blocks of the SOC that need to be checked against manufacturing faults. In the conventional scan chain distribution method, it is difficult to reduce the two factors on the right side of the equation (1), the number of scan chains and the length of the longest scan chain due to the fact that each of the ASLs and BFLs are part of the scan chain in the testing phase of the SOC 100.

In a typical SOC design, each of the ASLs may not necessarily be of use for a target application, hence it is not necessary for the manufacturer to test all of the ASLs. In the traditional technique, the length of the longest scan chain in the SOC design remains the same, even if some of the logic blocks in the ASLs do not need to be tested. Each of the ASLs is always present in the scan path during the process of testing the SOC design. This might result in the SOC design having a reduced manufacturing yield. For example, if the ASL 104 and ASL 112 are not required for some target application X, and there are no manufacturing faults in any of the ASLs and the BFLs except for in the ASL 104 and ASL 112, then the SOC could be used for the target application, but unless there is a method to determine that the fault was only in the ASL 104 and ASL 112, then the SOC may determined to be a bad part when in fact it could be used for the target application.

Figure 2:
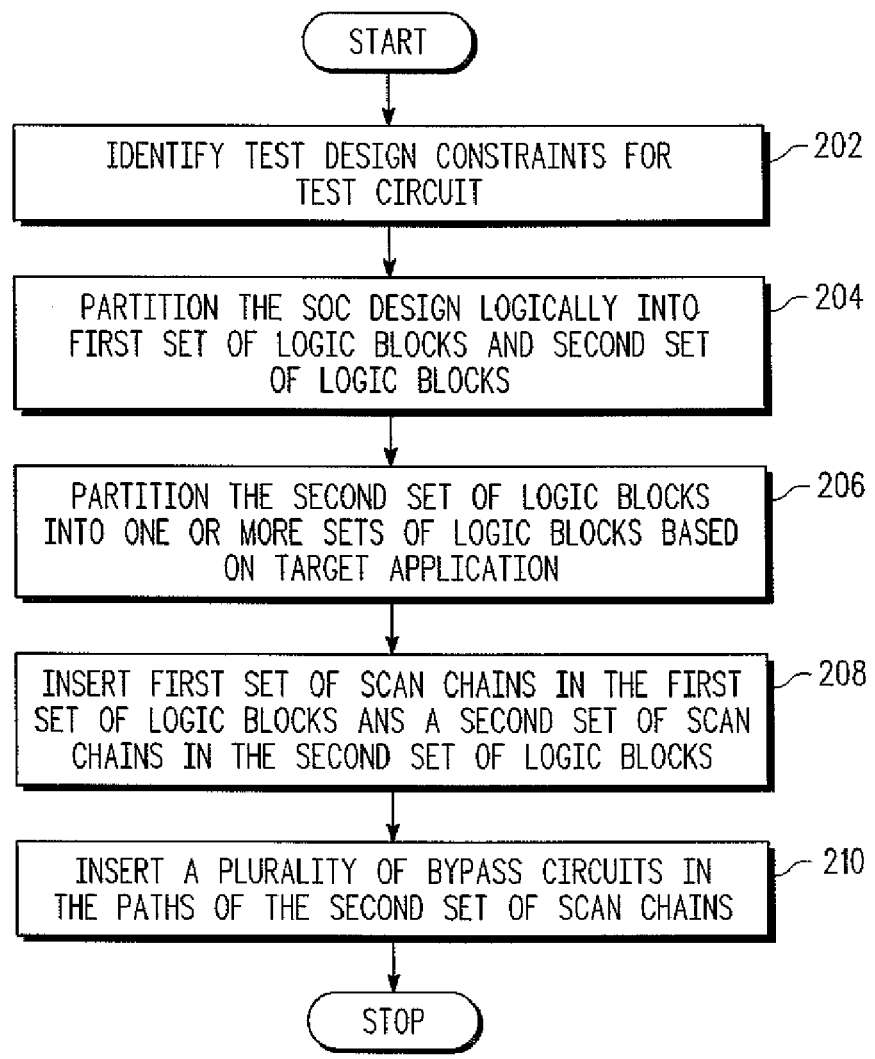
FIG. 2 is a flowchart depicting a method for designing a test circuit in an SOC design in accordance with an embodiment of the present invention.

FIG. 2 is a flowchart depicting a method for designing a test circuit in an SOC design, in accordance with an embodiment of the present invention. At step 202, test design constraints for the test circuit are identified, based on the number of input and output pins of the SOC design, and the number of channels in the Automatic Test Equipment (ATE) used to test the SOC design. At step 204, the SOC design is logically partitioned into a first set of logic blocks and a second set of logic blocks. In an embodiment of the present invention, the first set of logic blocks includes the BFLs of the SOC design. In the same embodiment, the second set of logic blocks includes the ASLs of the SOC design. The partitioning is done manually based on the product requirement and different customer application. At step 206, the second set of logic blocks is further partitioned into one or more sets of logic blocks, based on the target application of each logic block of the second set of logic blocks. At step 208, a first set of scan chains is inserted in the first set of logic blocks, and a second set of scan chains is inserted in the second set of logic blocks. In an embodiment of the present invention, the first set of scan chains includes N parallel scan chains, which are inserted in the first set of logic blocks. The second set of scan chains includes a set of N parallel scan chains. Each of the set of N parallel scan chains is inserted in one of the one or more sets of logic blocks of the second set of logic blocks.

At step 210, a plurality of bypass circuits is inserted in the second set of logic blocks. In an embodiment of the present invention, a bypass circuit is connected to the N scan chains of either a first set of logic blocks or a second set of logic blocks. The same bypass circuit is also connected to the N scan chain of second set of logic blocks. In the same embodiment, the bypass circuit can then bypass either the first scan chain or the second scan chain, based on the scan select signal, which can be user defined. Bypassing a scan chain results in bypassing the testing of the corresponding logic block of the SOC design. In other words, each of the plurality of bypass circuits is capable of bypassing at least one logic block of the second set of logic blocks from a test scan path during the process of testing the SOC design. The arrangement of a bypass circuit is explained further in conjunction with FIG. 4.

Figure 3:
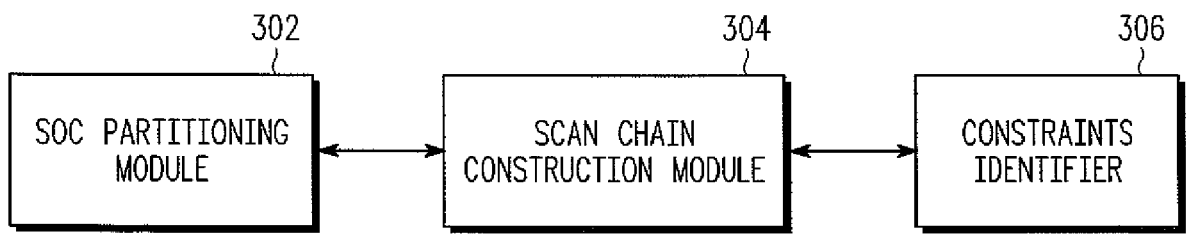
FIG. 3 is a schematic block diagram of a system for designing a test circuit in a SOC design in accordance with an embodiment of the present invention.

Referring now to FIG. 3, a schematic block diagram of a system for designing a test circuit 300 in an SOC design is shown, in accordance with an embodiment of the present invention. The system for designing the test circuit 300 includes an SOC partitioning module 302, a scan chain construction module 304, and a constraint identifier 306. The SOC partitioning module 302 partitions the SOC design logically into a first set of logic blocks and a second set of logic blocks. In an embodiment of the present invention, the first set of logic blocks are BFLs, and the second set of logic blocks are ASLs of the SOC design. The partitioning module 302 also partitions the second set of logic blocks into one or more sets of logic blocks, based on the target application of each logic block of the second set of logic blocks. In an embodiment of the present invention, the ASLs of the SOC design are logically partitioned into the one or more set of ASLs, based on a predefined target application of the SOC.

The scan chain construction module 304 inserts a first set of scan chains in the first set of logic blocks and a second set of scan chains in the second set of logic blocks. The first set of scan chains are chosen based on test design constraints. The test design constraints are identified based on the number of input and output pins of the SOC design and the number of channels in the Automatic Test Equipment (ATE) used to test the SOC design. The scan chain construction module 304 also inserts a plurality of bypass circuits in the second set of logic blocks. Each bypass circuit can bypass a scan chain of the second set of scan chains during testing of the SOC design.

Figure 4:
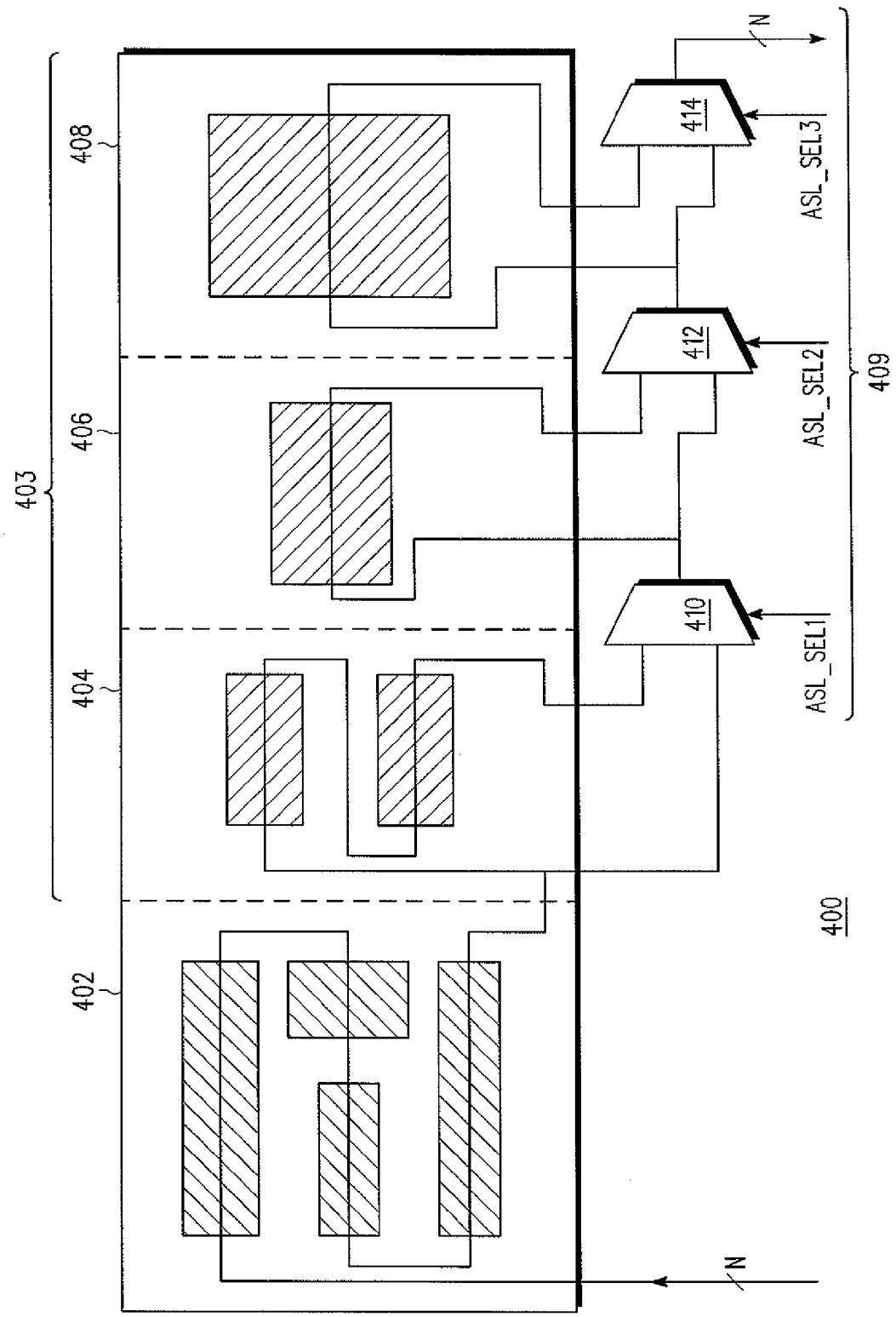
FIG. 4 is a schematic block diagram of a test circuit in an SOC design in accordance with an embodiment of the present invention.

Referring now to FIG. 4, a schematic block diagram of an SOC design 400 including a test circuit in accordance with an embodiment of the present invention is shown. The test circuit is an exemplary test circuit. The SOC design 400 includes a first set of logic blocks 402, and a second set of logic blocks 403, which includes first, second and third groups of logic blocks 404, 406 and 408, and a plurality of bypass circuits 409. The plurality of bypass circuits 409 includes first, second and third bypass circuits 410, 412, and 414. The SOC 400 also includes a first set of scan chains in the first set of logic blocks 402 and a second set of scan chains in the second set of the logic blocks 403. In an embodiment of the present invention, there are N parallel sets of scan chains (where N≧1 and N is an integer). The N parallel scan chains are inserted in each of the first set of logic blocks 402 as well as in each group of logic blocks 404, 406 and 408 of the second set of logic blocks 403. Each of the bypass circuits 410, 412 and 414 is a multiplexer with select lines ASL_SEL1, ASL_SEL2 and ASL_SEL3, respectively. Each of the bypass circuits 410, 412 and 414 is connected to the path of the N parallel scan chains such that each of the bypass circuits can bypass at least one group of logic blocks 404, 406 and 408 from the second set of logic blocks 403, based on the logic level of the corresponding select lines. For example, the bypass circuit 410 receives as inputs, the set of scan chains of the first set of logic blocks 402 and the set of scan chains of the first group of logic blocks 404. In an embodiment of the present invention, when the ASL_SEL1 is at a HIGH logic level, the bypass circuit 410 provides the set of scan chains of the group of logic blocks 404 as its output. In this embodiment, when the ASL_SEL1 is at a LOW logic level, the bypass circuit 410 provides the set of scan chains of the first set of logic blocks 402 as its output. In this event, the group of logic blocks 404 of the second set of logic blocks 403 is bypassed. Similarly, the bypass circuits 412 and 414 can bypass the groups of logic blocks 406 and 408, based on the logic levels of the ASL_SEL2 and the ASL_SEL3.

While various embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

The invention claimed is:

1. A method for designing a test circuit in a System on Chip (SOC) design using a system for designing a test circuit, wherein the system includes a constraint identifier, an SOC partitioning module, and a scan chain construction module, and wherein the SOC design includes a plurality of logic blocks, the method comprising:
   identifying test design constraints for the test circuit with the constraint identifier, wherein the test design constraints include a number of scan chains and an average length of a scan chain;
   logically partitioning the SOC design into at least a first set of logic blocks and a second set of logic blocks with the SOC partitioning module, wherein the first set of logic blocks includes design logic specific to basic features of the SOC design and the second set of logic blocks includes application specific logic of the SOC design;
   inserting a first set of scan chains in the first set of logic blocks and a second set of scan chains in the second set of logic blocks with the scan chain construction module, based on the test design constraints;
   inserting a plurality of bypass circuits in a path of at least one scan chain of the second set of scan chains with the scan chain construction module, wherein each of the bypass circuits is capable of bypassing at least one logic block of the second set of logic blocks during testing of the SOC design; and
   further comprising partitioning the second set of logic blocks into at least one subset of logic blocks based on a target application of each logic block of the second set of logic blocks prior to inserting the second set of scan chains.

2. The method for designing the test circuit in the SOC design of claim 1, wherein identifying the test design constraints is based on a number of input and output pins of the SOC design.

3. The method for designing the test circuit in the SOC design of claim 1, wherein identifying the test design constraints is based on a number of channels in an Automatic Test Equipment (ATE) used in testing of the SOC design.

4. A system for designing a test circuit in a System on Chip (SOC) design, the SOC design including a plurality of logic blocks, the system comprising:
   a constraints identifier connected to the scan chain construction module that identifies test design constraints, wherein the test design constraints are a number of scan chains and an average length of a scan chain;
   an SOC partitioning module that partitions the SOC design logically into a first set of logic blocks and a second set of logic blocks, wherein the first set of logic blocks includes design logic specific to basic features of the SOC design and the second set of logic blocks includes application specific logic of the SOC design, and further partitions the second set of logic blocks into at least one subset of logic blocks; and
   a scan chain construction module connected to the SOC partitioning module that inserts a first set of scan chains in the first set of logic blocks and a second set of scan chains in the second set of logic blocks, based on the test design constraints, and inserts a plurality of bypass circuits in the second set of logic blocks.

5. The system for designing the test circuit in a SOC design of claim 4, wherein the test design constraints are based on a number of input and output pins of the SOC design.

6. The system for designing the test circuit in the SOC design of claim 4, wherein the test design constraints are based on a number of channels in the Automatic Test Equipments (ATE) used in testing of the SOC design.

7. The system for designing the test circuit in the SOC design of claim 4, wherein each of the plurality of bypass circuits is capable of bypassing at least one logic block of the second set of logic blocks.

8. The system for designing the test circuit in the SOC design of claim 4, wherein each of the plurality of bypass circuits includes a multiplexer.

9. A computer program product stored on a computer storage device and operable on a computer system for designing a test circuit in a system on chip (SOC) design, the SOC design including a plurality of logic blocks, the computer program product comprising:
   a first set of program instructions executed by the computer system that identifies test design constraints for the test circuit, wherein the test design constraints are a number of scan chains and an average length of a scan chain;
   a second set of program instructions executed by the computer system that partitions the SOC design logically into at least a first set of logic blocks and a second set of logic blocks, wherein the first set of logic blocks includes design logic representing basic features of the SOC design and the second set of logic blocks includes application specific logic of the SOC design;
   a third set of program instructions executed by the computer system that inserts a first set of scan chains in the first set of logic blocks and a second set of scan chains in the second set of logic blocks; and
   a fourth set of program instructions executed by the computer system that inserts a plurality of bypass circuits in the second set of logic blocks, wherein each of the plurality of bypass circuits is capable of bypassing at least one logic block of the second set of logic blocks during testing of the SOC design; and
   wherein the second set of program instructions that partitions the SOC design comprises a fifth set of program instructions that partitions the second set of logic blocks into at least one subset of logic blocks based on a target application of each logic block of the second set of logic blocks.

* * * * *